(12) United States Patent
Thomsen et al.

(10) Patent No.: US 7,400,204 B2
(45) Date of Patent: Jul. 15, 2008

(54) LINEAR PHASE DETECTOR AND CHARGE PUMP

(75) Inventors: Axel Thomsen, Austin, TX (US); Ronald G. Spencer, Rockwall, TX (US)

(73) Assignee: Silicon Laboratories Inc., Austin, TX (US)

( * ) Notice: Subject to any disclaimer, the term of this patent is extended or adjusted under 35 U.S.C. 154(b) by 77 days.

(21) Appl. No.: 11/168,012

(22) Filed: Jun. 28, 2005

(65) Prior Publication Data

US 2006/0012439 A1 Jan. 19, 2006

Related U.S. Application Data

(60) Provisional application No. 60/583,475, filed on Jun. 28, 2004.

(51) Int. Cl.
*H03L 7/00* (2006.01)
(52) U.S. Cl. .............................. 331/25; 331/1 A; 327/2; 327/12; 375/375
(58) Field of Classification Search .................. 327/12, 327/2; 375/375; 331/16, 25, 1 A
See application file for complete search history.

(56) References Cited

U.S. PATENT DOCUMENTS

| | | | | |
|---|---|---|---|---|
| 4,935,707 A | * | 6/1990 | Irwin | 331/16 |
| 4,970,475 A | * | 11/1990 | Gillig | 331/25 |
| 5,926,041 A | * | 7/1999 | Duffy et al. | 327/12 |
| 6,011,822 A | * | 1/2000 | Dreyer | 375/376 |
| 6,169,458 B1 | | 1/2001 | Shenoy et al. | |
| 6,515,536 B2 | | 2/2003 | Liang et al. | |
| 6,747,506 B1 | | 6/2004 | Thiara | |
| 7,082,176 B2 | * | 7/2006 | Chien et al. | 375/374 |
| 7,092,475 B1 | * | 8/2006 | Huard | 375/375 |
| 2005/0185747 A1 | * | 8/2005 | White | 375/375 |
| 2006/0220711 A1 | * | 10/2006 | Sanduleanu et al. | 327/157 |

OTHER PUBLICATIONS

Novof, Illya I., et al., "Fully Integrated CMOS Phase-Locked Loop with 15 to 240 MHz Locking Range and +/−50 ps Jitter," IEEE Journal of Solid-State Circuits, vol. 30, No. 11, Nov. 1995, pp. 1259-1266.

* cited by examiner

*Primary Examiner*—Robert J. Pascal
*Assistant Examiner*—Levi Gannon
(74) *Attorney, Agent, or Firm*—Zagorin O'Brien Graham LLP (57) ABSTRACT

A phase detector detects a phase difference between a first and second signal received by a phase detector. A charge is supplied by a charge pump circuit that corresponds to the phase difference using a phase difference to charge conversion that is substantially linear and nonzero in a phase error region that includes a phase error transition region around a phase error of zero having both negative and positive phase error values. Dual determinations, q1 and q2, offset from each other are made of an appropriate charge for a given phase error between the first and second signals. The charge pump supplies as the total charge pump output a charge value representing a combination of q1 and q2, thereby providing a phase error to charge conversion that is substantially linear in the phase error transition region around zero. A first and second output of the phase detector circuit respectively supplying UP and DOWN signals to the charge pump circuit are delayed and supplied as additional outputs of the phase detector circuit and used in generating the dual charge determinations q1 and q2.

21 Claims, 9 Drawing Sheets

LINEAR PHASE DETECTOR AND CHARGE PUMP

BACKGROUND

1. Field of the Invention

This application relates to phase detectors and more particularly to linear phase detectors and associated charge pump circuits.

2. Description of the Related Art

Figure 1A:
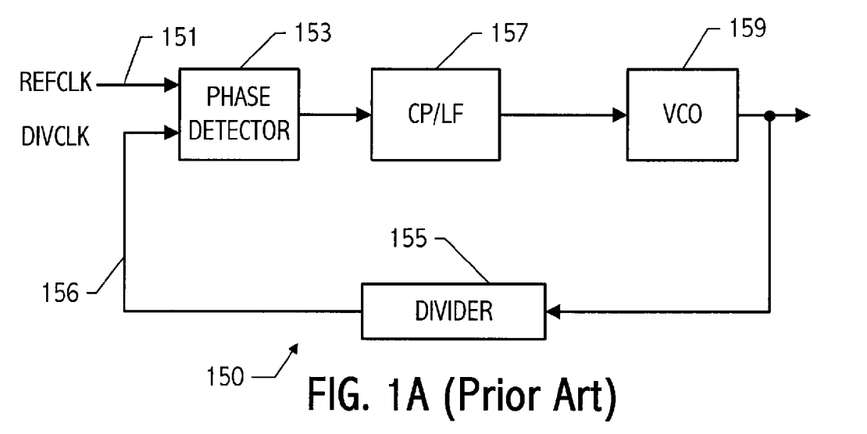
FIG. 1A is an exemplary phase-locked loop.

FIG. 1A illustrates a simplified high level block diagram of a phase-locked loop 150. A reference clock (REFCLK) supplied on node 151 is received by the phase/frequency detector 153, which also receives a feedback clock (DIVCLK) from the divider circuit 155 on node 156. The phase detector detects the difference between the reference clock and the feedback clock and the charge pump 157 generates a charge corresponding to that difference to drive the voltage controlled oscillator (VCO) 159. In that way the VCO output is adjusted up and down to remain "locked" to the reference clock.

Figure 1B:
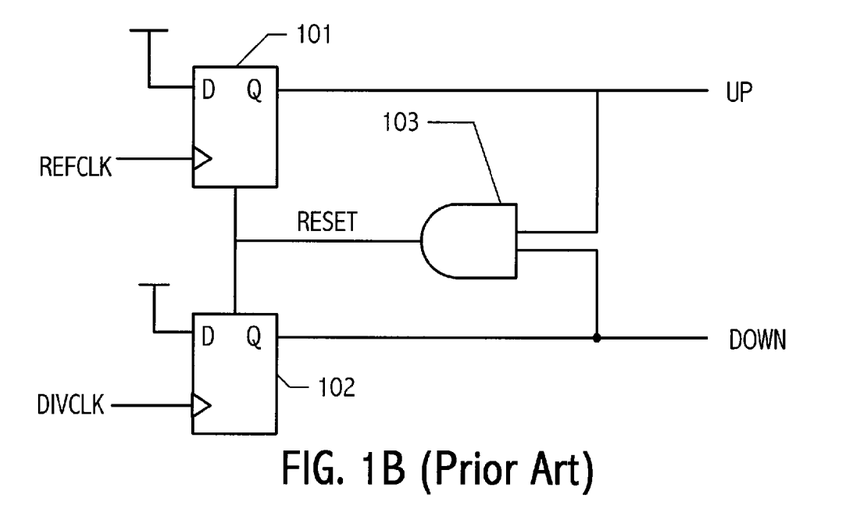
FIG. 1B illustrates a prior art phase detector.
Figure 1C:
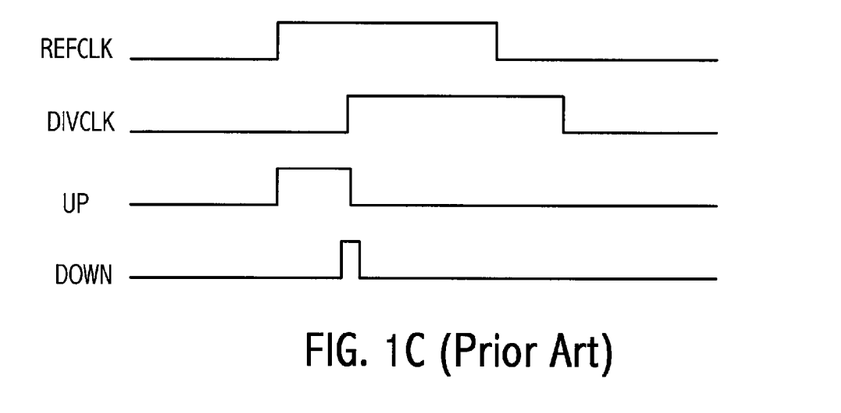
FIG. 1C illustrates a timing diagram illustrating operation of the phase detector in FIG. 1B.

An exemplary prior art phase detector is shown in FIG. 1B and its operation is described in FIG. 1C. When the REFCLK supplied to flip flop 101 leads the DIVCLK supplied to flip-flop 102 a pulse on UP is created as shown in FIG. 1C. In addition, when DIVCLK transitions then from a 0 to a 1 a RESET signal is asserted by AND gate 103, and a short pulse on DOWN is created whose length is determined by the delay through the reset path. The UP and DOWN pulses are used to control the exemplary charge pump shown in FIG. 1D.

Figure 1D:
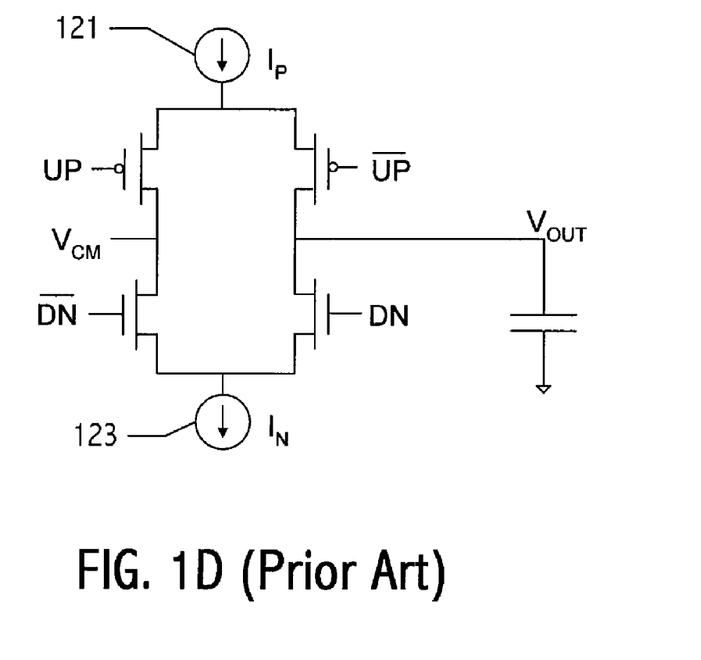
FIG. 1D illustrates a prior art charge pump that can be driven by the phase detector of FIG. 1B.
Figure 1E:
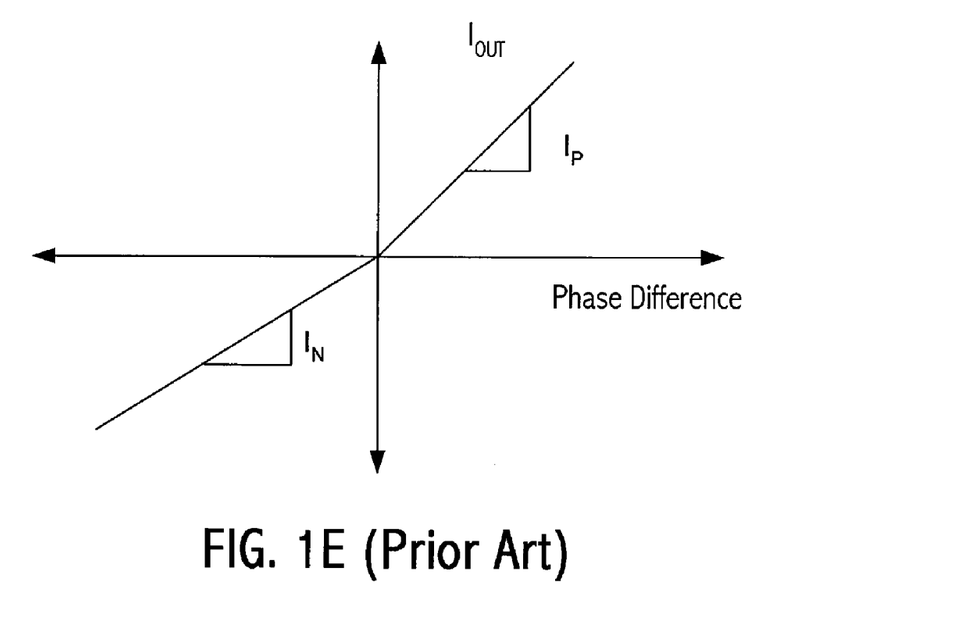
FIG. 1E illustrates the linearity problem associated with prior art charge pumps such as the one illustrated in FIG. 1D.

However, the charge pump illustrated in FIG. 1D utilizes separate current sources 121 ($I_P$) and 123 ($I_N$) to control the charge supplied to control the oscillator. Those current sources are not absolutely identical, which results in a non-linearity in a phase error transition region around 0 as shown in FIG. 1E. That approach may be acceptable for phase-locked loops in which the PLL output is an integer multiple of the reference clock. However, such nonlinearity is unacceptable for fractional-N phase-locked loops.

Accordingly, it would be desirable to provide a linear phase detector that avoids the non-linearity problem associated with the charge pump shown in FIG. 1D.

SUMMARY

In one embodiment a method is provided that includes detecting a phase difference between a first and second signal received by a phase detector and supplying a charge that corresponds to the phase difference using a phase difference to charge conversion that is substantially linear and nonzero in a phase error region that includes a phase error transition region around a phase error of zero having both negative and positive phase error values. The method uses a phase difference to charge conversion that is substantially linear by making dual determinations, q1 and q2, offset from each other, of an appropriate charge for a given phase error between the first and second signal. A charge pump supplies as the total charge pump output a charge value representing a combination of q1 and q2, thereby providing a phase error to charge conversion that is substantially linear in the phase error transition region around zero. The method may further include delaying a first and second output of the phase detector circuit respectively supplying an UP and DOWN signal to the charge pump circuit and supplying as additional outputs of the phase detector circuit a delayed UP signal (UP_DLY) and a delayed DOWN signal (DN_DLY) to help generate the dual charge determinations q1 and q2.

In another embodiment an apparatus is provided that includes a phase detector circuit coupled to receive a first and second signal and supply a plurality of phase detector output signals derived from a timing difference between the first and second signals. The apparatus further includes a differential charge pump circuit including at least a first and a second current source coupled through respective control switches to respective negative and positive output nodes of the differential charge pump circuit, the control switches controlled by logical combinations of the phase detector output signals such that the charge pump supplies as a time averaged charge pump output over every update interval a charge value representing a combination of dual charge determinations to provide a phase error to charge conversion that is substantially linear in the phase error transition region around a zero phase error.

In another embodiment a method is provided that includes detecting a phase difference between a first and second signal received by a phase detector; and making dual charge determinations offset from each other for the phase difference and combining the dual charge determinations to generate an actual charge corresponding the phase difference.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1F:
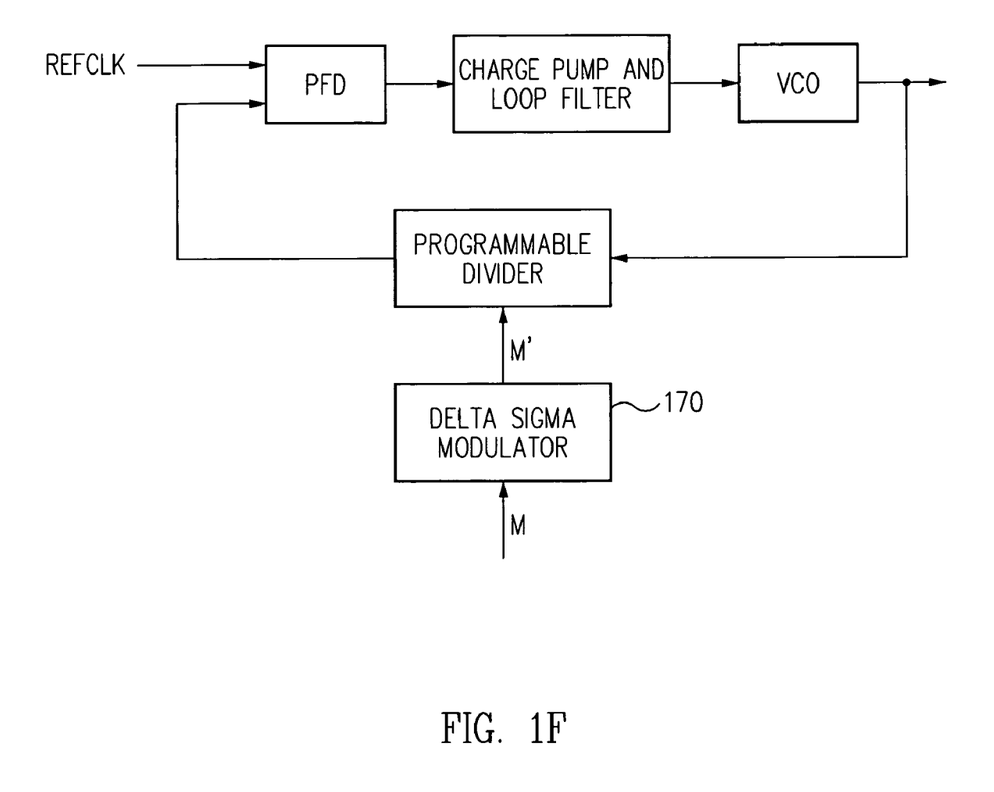
FIG. 1F illustrates an exemplary fractional-N phase-locked loop.

A fractional-N phase-locked loop is shown in FIG. 1F, in which the output signal of the PLL can be a non-integer multiple of the reference clock. As shown in FIG. 1F a ratio-nal number M, controlling the output frequency of the PLL is converted by delta sigma modulator 170 to a stream of integers that averages the rational number M over time.

Figure 2:
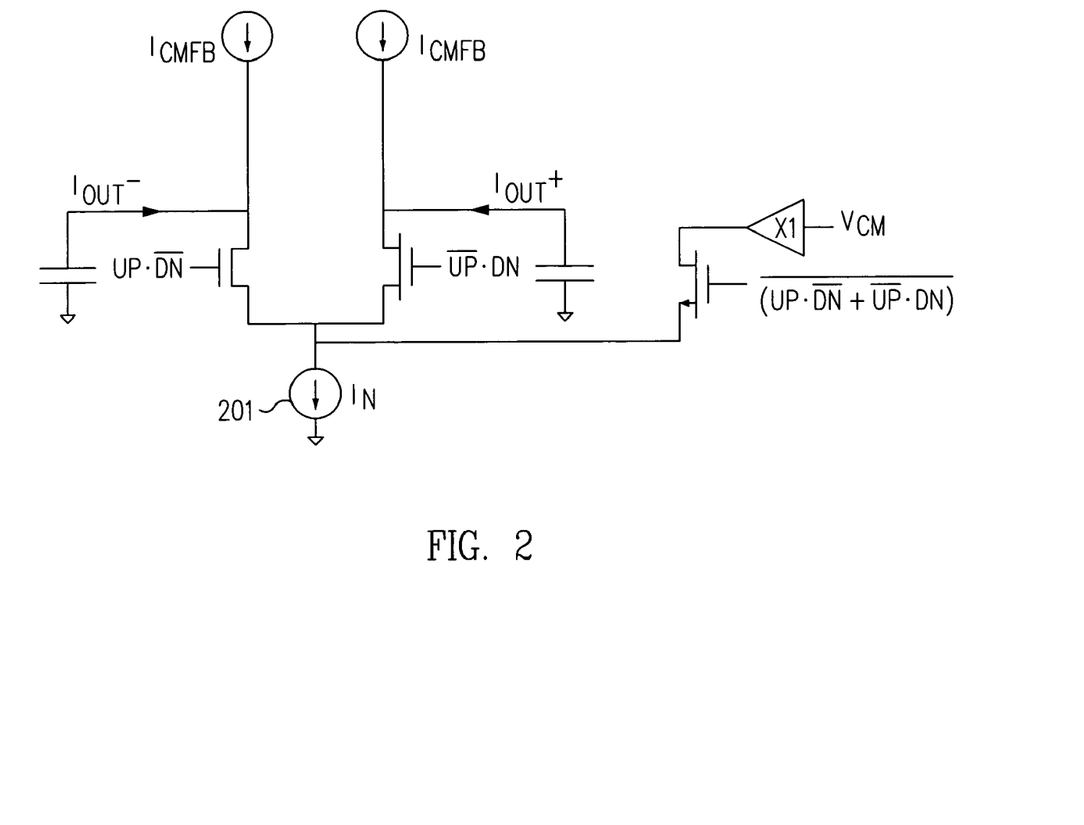
FIG. 2 illustrates a charge pump that addresses the non-linearity illustrated in FIG. 1E.
Figure 3:
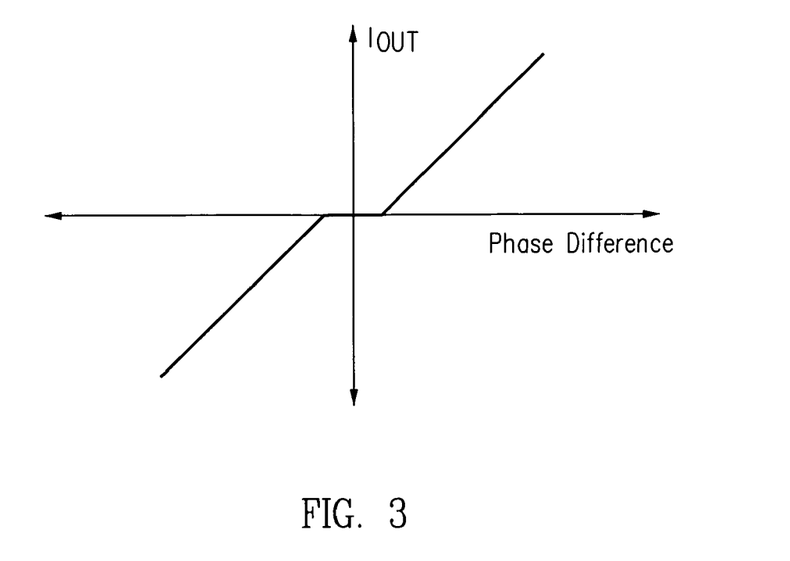
FIG. 3 illustrates the non-linear region associated with the charge pump of FIG. 2.

One solution for the non-linearity associated with the mismatch between ($I_P$) and ($I_N$) in the charge pump illustrated in FIG. 1D is to use the charge pump illustrated in FIG. 2, which utilizes a single current source 201 and logic signals that determine whether to pull down the plus or minus node (the equivalent of UP). However, using that logic can introduce a delay that causes the output transfer function to have a dead zone in the middle such as illustrated in FIG. 3 in which the phase error to charge transition has a zero slope.

Figure 4A:
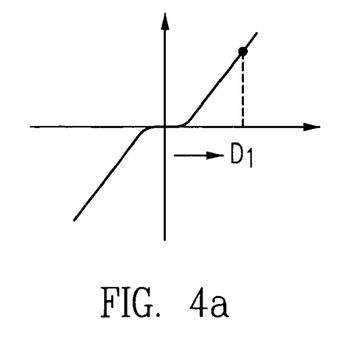
FIGS. 4a-4f illustrate conversion from phase error to time averaged output current in which a delay bias is incorporated.
Figure 4B:
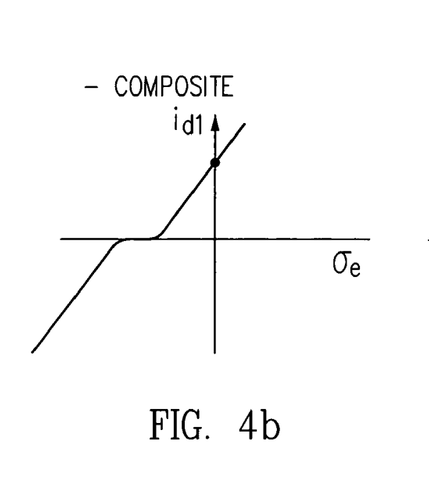
Figure 4C:
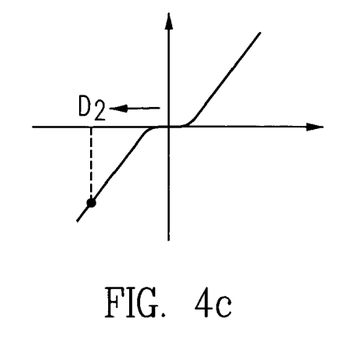
Figure 4D:
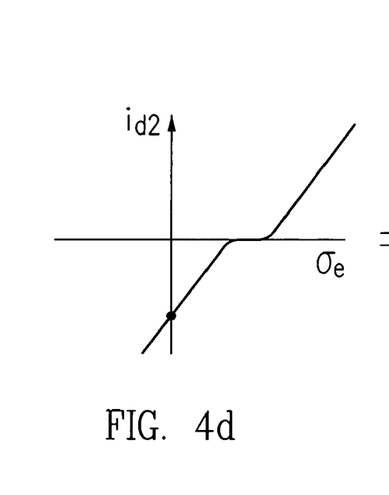
Figure 4E:
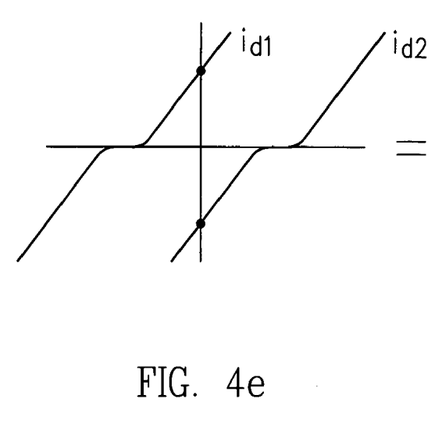
Figure 4F:
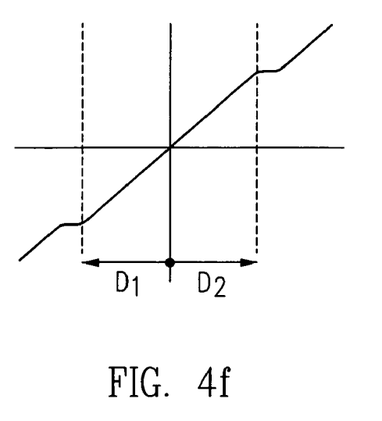

Referring to FIGS. 4a-4f, according to an embodiment of the invention, a delay offset is introduced and used in determining the control signals for the charge pump. For example, as illustrated in FIGS. 4a and 4b, an offset of D1 is utilized to determine the amount of time averaged current (or charge) to supply based on the phase error. Similarly in FIGS. 4c and 4d an offset of D2 (in the opposite direction of FIG. 4b) is utilized to determine the amount of charge to supply for a given phase error. If the curves as shown in FIG. 4e are added together, the resultant phase error to charge conversion is shown in FIG. 4f to be linear in the phase error transition region around 0.

Figure 5:
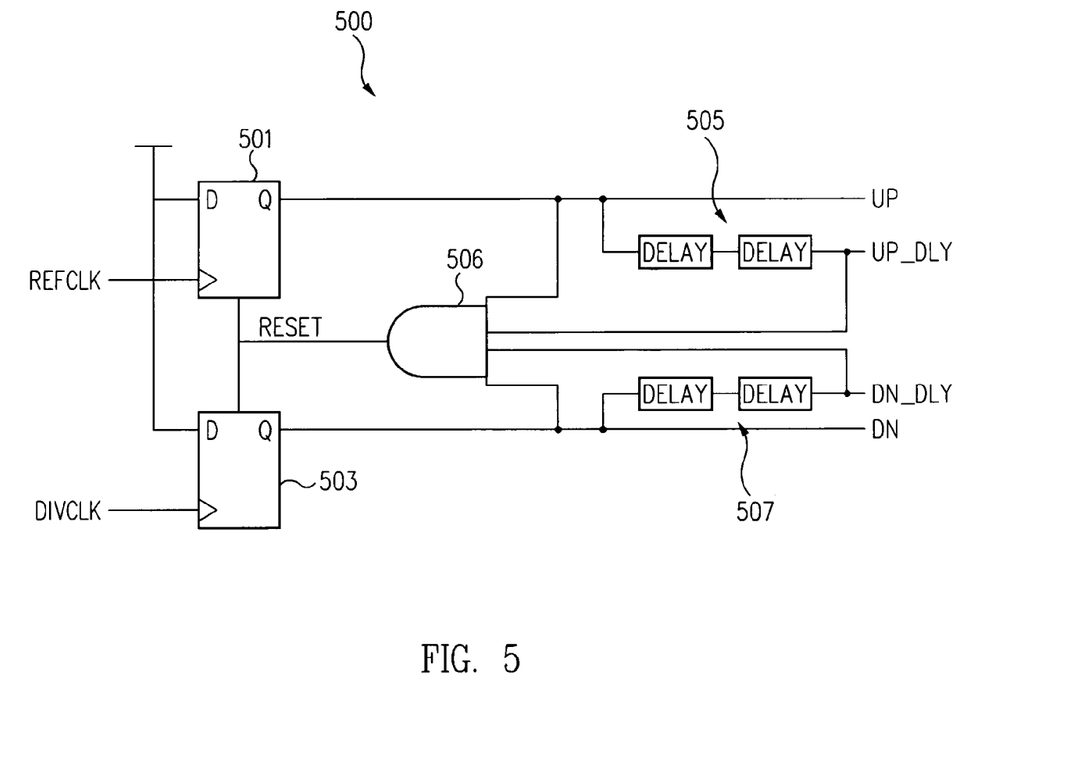
FIG. 5 illustrates an exemplary phase detector according to an embodiment of the invention providing the delay bias.

Referring to FIG. 5, a phase detector is illustrated that can be utilized to generate the delay illustrated in FIG. 4e. The linear phase detector 500 includes a first flip-flop 501 and a second flip-flop 503 coupled to respectively receive the REFCLK and the DIVCLK. Assume the REFCLK is a reference clock being supplied to a PLL as in FIG. 1F and the DIVCLK is a divided feedback clock signal from the output of the PLL feedback divider. The UP and DN signals are asserted when the REFCLK and DIVCLK, respectively, go high. In addition, delay elements 505 and 507, corresponding to D1 and D2 shown in FIGS. 4a-4e, generate the delay signals UP_DLY and DN_DLY respectively. The reset AND gate 510 resets the flip-flops 501 and 503 when UP, UP_DLY, DN and DN_DLY are all asserted. In order to generate the offsets illustrated in FIGS. 4a-4e, the UP signal is compared to DN_DLY and the DN signal is compared to UP_DLY.

In an alternative embodiment, the delay creating UP_DLY and DN_DLY is only applied to the rising edge of UP or DN respectively. That will shrink the width of B1 and B2 to zero.

Figure 6:
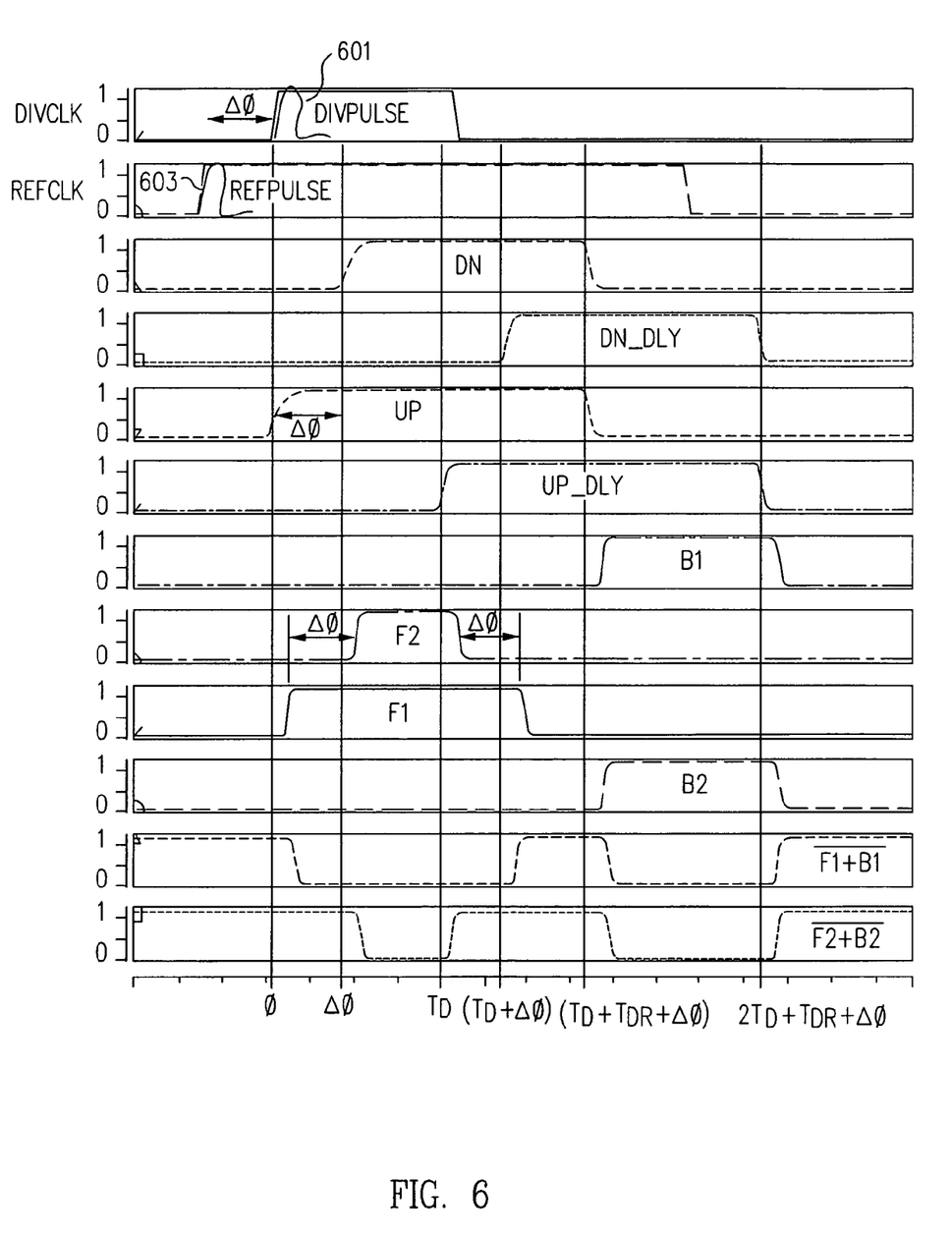
FIG. 6 illustrates a timing diagram illustrating operation of the phase detector of FIG. 5 and generation of control signals for a charge pump.

Operation of the phase detector 500 will now be described with reference to FIG. 6. The time difference, $\Delta\phi$, between the reference clock (REFCLK) and the feedback clock (DIVCLK) edges needs to be accurately converted to a charge signal to appropriately control the oscillator. The difference in the duration of these pulses leads to the output charge delivered. As shown in FIG. 6, the difference in the duration of the high logic states for the up (UP) and the down (DN) signals is also $\Delta\phi$. In the embodiment illustrated the 0 to 1 transition on each of the inputs—that is, REFCLK and DIVCLK initiates up and down pulses.

Assume all outputs are initialized to logic 0, and the delays, D1 and D2, shown in FIGS. 4a-4e, are assumed to be equal to a target delay of $T_D$. In addition, a delay associated with the reset delay path is assumed to be $T_{DR}$. Assume, as shown in FIG. 6 that REFCLK goes high and at time t=0 UP transitions from 0 to 1. After a time period $\Delta\phi$, DN transitions from 0 to 1. The time between the transitions of UP and DN are assumed to be the same as the time period between the transitions of REFCLK and DIVCLK, that is $\Delta\phi$. Then at time, t=$T_D$, UP_DLY goes high and at time t=$T_D+\Delta\phi$, DN_DLY goes high. The time period $T_D$ corresponds to the delay 505 and 507 in the phase detector 500. At time t=$T_D+\Delta\phi+T_{DR}$, the reset AND gate 506 goes high and the reset has propagated through the logic to cause UP and DN to transition from 1 to 0. After those signals transition, the delayed signals transition from 1 to 0 after a further delay of $T_D$ or at t=$2T_D+T_{DR}+\Delta\phi$.

As described in relation to FIGS. 4e-4f, dual determinations are made, offset from each other, of an appropriate charge for a given phase error and combined to generate the actual charge. In one embodiment control signals are generated based on the UP, DN, UP_DLY and DN_DLY signals and used to control a differential charge pump circuit such as the exemplary charge pump circuit shown in FIG. 7.

Figure 7:
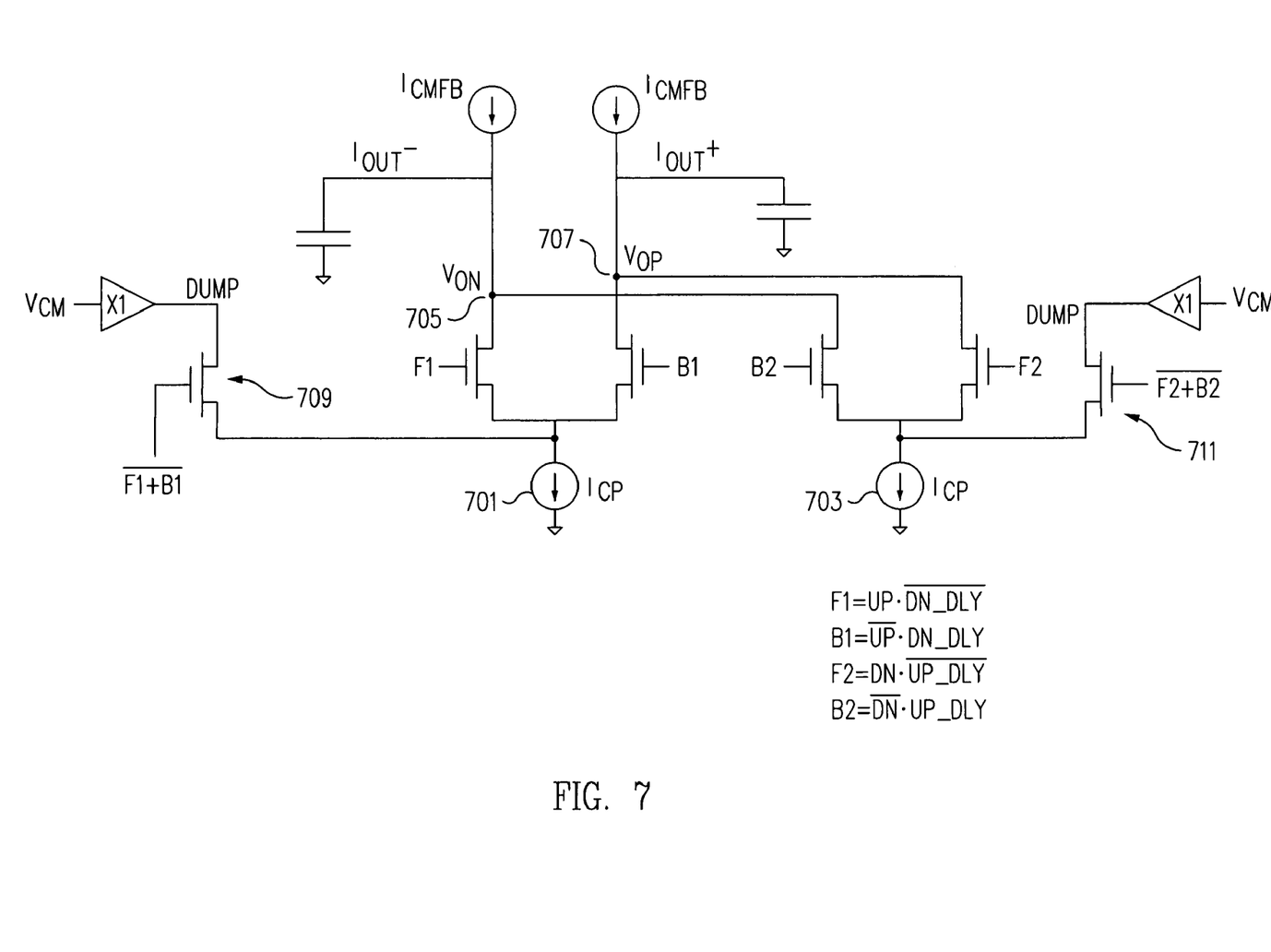
FIG. 7 illustrates an exemplary charge pump circuit according to an embodiment of the invention.

FIG. 7, shows a charge pump 700 having two current sources 701 and 703 that can be independently controlled using the control signals derived from the phase detector 500. In one embodiment, the left side signals control a first current source 701 and the right side signals control a second current source 703. The logic used to derive these control signals is defined to be, $$F1 = UP \cdot \overline{DN\_DLY} = T_D + \Delta\phi$$

$$B1 = \overline{UP} \cdot DN\_DLY = 2T_D + T_{DR} + \Delta\phi - (T_D + T_{DR} + \Delta\phi) = T_D$$

$$B2 = UP\_DLY \cdot \overline{DN} = 2T_D + T_{DR} + \Delta\phi - (T_D + T_{DR} + \Delta\phi) = T_D$$

$$F2 = DN \cdot \overline{UP\_DLY} = T_D - \Delta\phi$$

As shown in FIG. 7, when F1 is on, the current source 701 pulls down the negative ($V_{ON}$) output node 705 and when F2 is on the current source 703 pulls down the positive output node ($V_{OP}$) 707. Referring again to FIG. 6, F2, F1, B2, and B1, are shown. Observe that the pairs of left (F1, B1) and right (F2, B2) logic signals are mutually exclusive and may therefore be used to direct the respective current sources 701 and 703. When both control signals on a side are low, e.g., $\overline{F1+B1}$ or $\overline{F2+B2}$ then the current source is routed to a "throw away" or dump node, through the control switches 709 and 711 to ensure the positive or negative outputs are unaffected.

Note that in FIG. 7, the controlling pulses are F1 ($T_D+\Delta\phi$) and F2 ($T_D-\Delta\phi$) while B1 and B2 are simply equal to the delay $T_D$. Thus, F1 and F2 correspond to the phase/charge conversion shown in FIG. 4e. In some embodiments, the B1 and B2 control signals are unnecessary. When F1 and F2 are not on, the current is steered to the appropriate dump node. In other embodiments, B2 and B1 may be added to the charge pump circuit and provide some improvement in 1/f noise associated with the charge pump circuit.

Referring again to FIG. 6, note that a DIV pulse 601 and a REF pulse 603 are illustrated. In some embodiments it may be preferred to utilize those pulses to drive the phase detector rather than use the entire clock waveforms. In that way variations in circuit operation (e.g., in rise times or fall times) in the phase detector and control signal generation that are determined according to the value of the clock signals may be avoided.

Looking at FIGS. 6 and 7, the time averaged current or charge at every update interval on charge pump output nodes 705 and 707 may be described by the following equations:

$$q_{705} = I_{701} \cdot (T_D+\Delta\phi) + I_{703} \cdot T_D$$

$$q_{707} = I_{703} \cdot (T_D-\Delta\phi) + I_{701} \cdot T_D$$

The total charge pump output, $q_{CP}$, by taking the difference of these charges. Thus, $$q_{CP} = q_{705} - q_{707} = (I_{701}+I_{703})\Delta\phi + (I_{701}-I_{703})T_D$$

Notice that the input time difference, $\Delta\phi$, results in an output of $2I_{CP} \Delta\phi$ at every update interval, assuming that $I_{701}=I_{703}=I_{CP}$.

Figure 8:
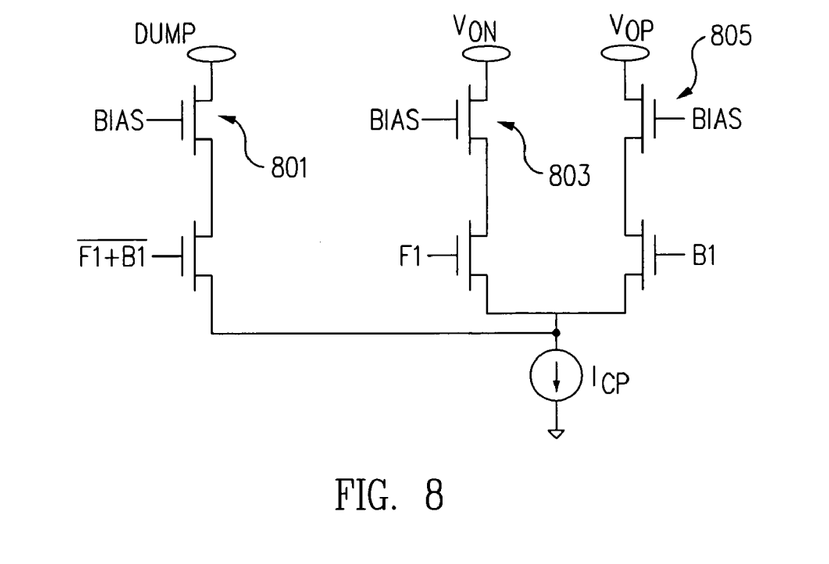
FIG. 8 illustrates additional details of a charge pump circuit according to an embodiment of the invention.

In an embodiment, referring to FIG. 8, additional transistors 801, 803, and 805 may be utilized to ensure that short circuits do not occur between $V_{ON}$, $V_{OP}$ and the dump location when switching between the control signals to steer the current to the appropriate place. While a bias voltage is shown being utilized for transistors 801, 803, 805, in other embodiments, an appropriate control voltage could be used to switch the transistors on and off.

Figure 9:
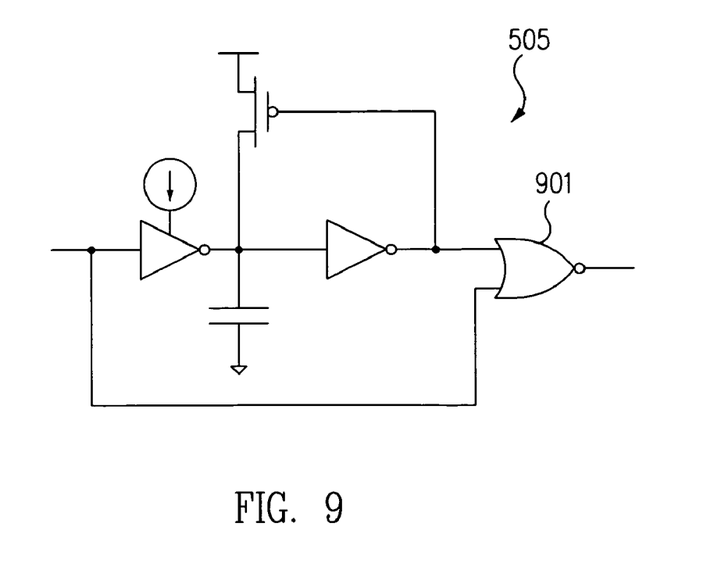
FIG. 9 illustrates an exemplary delay circuit that may be utilized for the delay elements in FIG. 5.

Referring to FIG. 9, illustrated is an exemplary delay circuit that can be utilized to create the delay circuits utilized in delays 505 and 507 shown in FIG. 5. The rising edge passes through the NOR gate 901 while the falling edge causes a slow pullup.

Thus, various embodiments have been described for implementing linear phase detector and associated charge pump. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   detecting a phase difference between a first and second signal received by a phase detector;
   supplying a charge that corresponds to the phase difference using a phase difference to charge conversion that is substantially linear and nonzero in a phase error region that includes a phase error transition region around a phase error of zero having both negative and positive phase error values;
   making dual determinations, q1 and q2, offset from each other, of an appropriate charge for a given phase error between the first and second signal;
   supplying as a total charge pump output a charge value representing a combination of q1 and q2, thereby providing a phase error to charge conversion that is substantially linear in the phase error transition region;
   delaying a first and second output of the phase detector circuit respectively supplying an UP and DOWN signal to the charge pump circuit and supplying as additional outputs of the phase detector circuit a delayed UP signal (UP_DLY) and a delayed DOWN signal (DN_DLY); and
   resetting the outputs of the phase detector using the delayed UP and the delayed DOWN signals.

2. The method as recited in claim 1 wherein a first delay utilized to generate the UP_DLY signal and a second delay utilized to generate the DN_DLY signal are substantially equal.

3. The method as recited in claim 1 further comprising using logical combinations of the outputs of the phase detector to selectively couple a first and a second current source in the charge pump, respectively, to negative and positive output nodes in the charge pump.

4. The method as recited in claim 3 wherein the first current source is utilized to pull down the negative output node and the second current source is utilized to pull down the positive output node.

5. The method as recited in claim 4 wherein the first current source is utilized to pull down the negative output node utilizing UP·$\overline{\text{DN\_DLY}}$ as a control signal and the second current source is utilized to pull down the positive output node utilizing DN·$\overline{\text{UP\_DLY}}$ as a control signal.

6. The method as recited in claim 4 further comprising coupling the first current source to another node through a control switch when the first current source is not pulling down the negative output node.

7. The method as recited in claim 3 wherein the first current source is further selectively coupled to pull down the positive output node and the second current source is further selectively coupled to pull down the negative output node.

8. The method as recited in claim 1 wherein resetting the output of the phase detector further uses the UP and DOWN signals.

9. An apparatus comprising:
   a phase detector circuit coupled to receive a first and second signal and supply a plurality of phase detector output signals derived from a timing difference between the first and second signals; and
   a differential charge pump circuit including at least a first and a second current source coupled through respective control switches to respective negative and positive output nodes of the differential charge pump circuit, the control switches coupled to be controlled by logical combinations of the phase detector output signals such that the charge pump supplies as a time averaged charge pump output over every update interval a charge value representing a combination of dual charge determinations to provide a phase error to charge conversion that is substantially linear in a phase error transition region around a zero phase error;
   wherein the phase detector supplies as part of the phase detector output signals a first (UP) and a second (DN) phase detector output signal indicative of the timing difference between the first and second signals and the phase detector further comprises a first and a second delay circuit, and supplies, as part of the phase detector output signals from the first and second delay circuits, respectively, a delayed first phase detector output signal (UP_DLY) and a delayed second phase detector output signal (DN_DLY);
   wherein the first current source is coupled to selectively pull down the negative output node utilizing UP·$\overline{\text{DN\_DLY}}$ as a control signal to one of the control switches, and wherein the second current source is coupled to selectively pull down the positive output node utilizing DN·$\overline{\text{UP\_DLY}}$ as a control signal to another one of the control switches.

10. The apparatus as recited in claim 9 wherein a first delay of the first delay circuit and a second delay of the second delay circuit are substantially equal.

11. The apparatus as recited in claim 10 wherein the time averaged charge pump output at every update interval is substantially $\Delta\phi(I_1+I_2)+T_D(I_1-I_2)$ where $I_1$ and $I_2$ are respectively the current of the first and second current sources, and $\Delta\phi$ is the timing difference between the first and second input signals and $T_D$ is a length of the first and second delay.

12. The apparatus as recited in claim 11 wherein $I_1$ and $I_2$ are substantially equal.

13. The apparatus as recited in claim 9 further comprising a reset circuit coupled to use the delayed first phase detector output signal (UP_DLY) and the delayed second phase detector output signal (DN_DLY) in resetting the outputs of the phase detector.

14. The apparatus as recited in claim 9 further comprising another node coupled to the first current source when the first current source is not pulling down the negative output node.

15. The apparatus as recited in claim 9 wherein the difference in duration of UP·$\overline{\text{DN\_DLY}}$ and DN·$\overline{\text{UP\_DLY}}$ is $2\Delta\phi$, where $\Delta\phi$ is the timing difference.

16. The apparatus as recited in claim 9 wherein the dual charge determination corresponds to (UP·$\overline{\text{DN\_DLY}}$)×$I_1$ and (DN·$\overline{\text{UP\_DLY}}$)×$I_2$, where $I_1$ and $I_2$ are respectively currents of the first and second current sources.

17. The apparatus as recited in claim 9 further comprising a controllable oscillator coupled to the charge pump and configured with the phase detector to form a phase-locked loop.

18. An apparatus comprising:
a phase detector circuit coupled to receive a first and second signal and supply a plurality of phase detector output signals derived from a timing difference between the first and second signals;
wherein the phase detector output signals include a first phase detector output signal and a second phase detector output signal, the first and second phase detector output signals indicative of the timing difference between the first and second signals and the phase detector further comprises a first and second delay circuit coupled respectively to the first and second output signals, the first and second delay circuits to supply respectively, a delayed first phase detector output signal and a delayed second phase detector output signal; and
wherein the phase detector includes a reset circuit to generate a signal to reset the output signals of the phase detector, the reset circuit coupled to receive as inputs the delayed first phase detector output signal and the delayed second phase detector output signal.

19. The apparatus as recited in claim 18 wherein the first and second delay circuits are operable to delay only the rising edge of the delayed first and second phase detector output signals.

20. A method comprising:
detecting a phase difference between a first and second signal received by a phase detector circuit;
supplying as a first and second output of the phase detector circuit an UP and DOWN signal to a charge pump circuit;
delaying the UP and DOWN signal and supplying a delayed UP signal (UP_DLY) and a delayed DOWN signal (DN_DLY) to the charge pump circuit; and
using a logical combination of the UP and DN_DLY signals to selectively couple a first current source in the charge pump circuit to a negative output node of the charge pump circuit and using a logical combination of the DN and UP_DLY signals to selectively couple a second current source in the charge pump circuit to a positive output node of the charge pump circuit.

21. An apparatus comprising:
a phase detector coupled to detect a phase difference between a first and second signal received by the phase detector and to generate an UP and DOWN signal and a delayed UP signal (UP_DLY) and a delayed DOWN signal (DN_DLY);
a differential charge pump circuit coupled to the phase detector, the charge pump circuit including a first current source selectively coupled through a first control switch to a negative output node a second current source selectively coupled through a second control switch to a positive output node; and
wherein the UP and DN_DLY signals are logically combined to generate a first control signal to control the first control switch and the DOWN and UP_DLY signals are logically combined generate a second control signal to control the second control switch.

* * * * *